(12) United States Patent
Weber et al.

(10) Patent No.: US 8,399,325 B2
(45) Date of Patent: *Mar. 19, 2013

(54) METHOD FOR PRODUCING AN ELECTRODE STRUCTURE

(75) Inventors: Hans Weber, Bayerisch Gmain (DE); Stefan Gamerith, Villach (AT); Roman Knoefler, Villach (AT); Kurt Sorschag, Villach (AT); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 13/240,308

(22) Filed: Sep. 22, 2011

(65) Prior Publication Data
US 2012/0083085 A1    Apr. 5, 2012

Related U.S. Application Data

(63) Continuation-in-part of application No. 12/894,141, filed on Sep. 30, 2010, now Pat. No. 8,288,230.

(51) Int. Cl.
*H01L 21/336* (2006.01)

(52) U.S. Cl. .......... 438/270; 438/700; 257/E21.41; 257/E21.419

(58) Field of Classification Search .......... 438/270, 438/700; 257/E21.41, E21.419
See application file for complete search history.

(56) References Cited

U.S. PATENT DOCUMENTS

| | | | |
|---|---|---|---|
| 6,444,528 B1 * | 9/2002 | Murphy | 438/270 |
| 7,345,338 B1 * | 3/2008 | Han et al. | 257/330 |
| 2009/0053869 A1 * | 2/2009 | Hirler | 438/270 |

* cited by examiner

*Primary Examiner* — Julia Slutsker
(74) *Attorney, Agent, or Firm* — Murphy, Bilak & Homiller, PLLC

(57) ABSTRACT

A method for producing a semiconductor device with an electrode structure includes providing a semiconductor body with a first surface, and with a first sacrificial layer extending in a vertical direction of the semiconductor body from the first surface, and forming a first trench extending from the first surface into the semiconductor body. The first trench is formed at least by removing the sacrificial layer in a section adjacent to the first surface. The method further includes forming a second trench by isotropically etching the semiconductor body in the first trench, forming a dielectric layer which covers sidewalls of the second trench, and forming an electrode on the dielectric layer in the second trench, the electrode and the dielectric layer in the second trench forming the electrode structure.

26 Claims, 11 Drawing Sheets

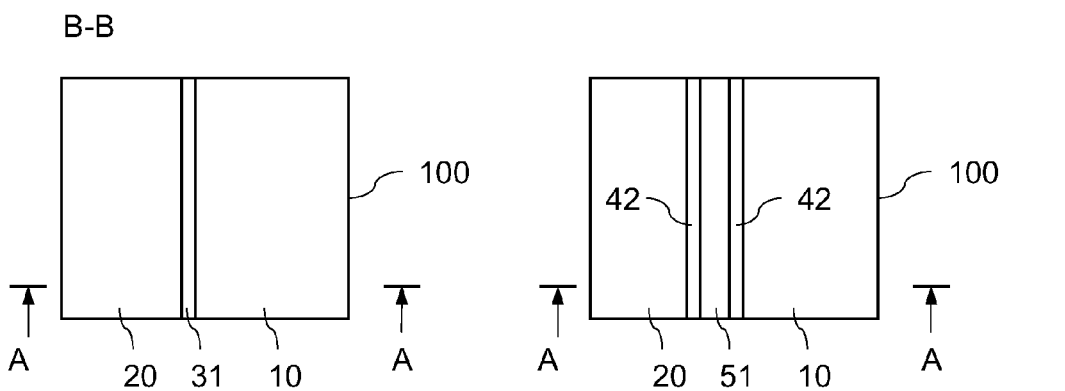
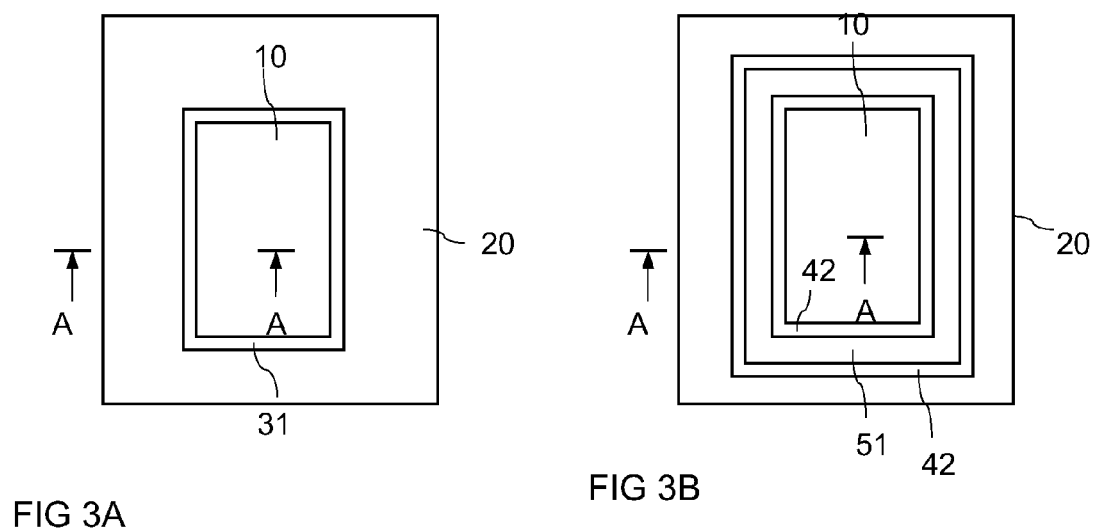

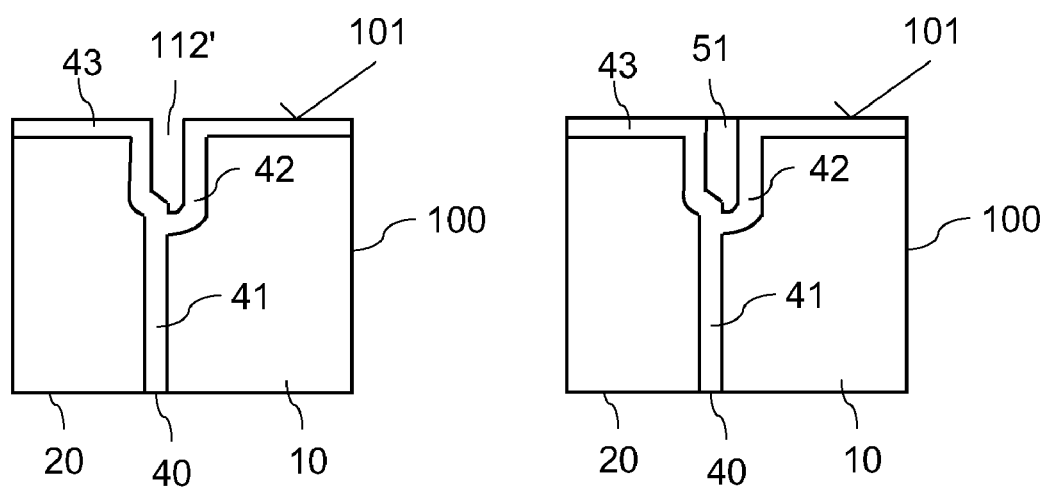

METHOD FOR PRODUCING AN ELECTRODE STRUCTURE

PRIORITY CLAIM

This application is a continuation-in-part of U.S. patent application Ser. No. 12/894,141 filed 30 Sep. 2010, the content of said application incorporated herein by reference in its entirety.

TECHNICAL FIELD

Embodiments of the present invention relate to a method for producing a semiconductor device with an electrode structure. In particular, embodiments of the present invention relate to a method for producing a transistor, like a MOSFET, including a gate electrode structure, and in particular to a method for producing a transistor which besides a gate electrode includes a drift control region adjacent to a drift region.

BACKGROUND

A specific type of MOSFET is known which includes a gate electrode structure with a gate electrode and a gate dielectric, and includes a drift control structure with a drift control region and a drift control region dielectric. The gate structure is arranged adjacent to a body region of the MOSFET, and the drift control structure is arranged adjacent to a drift region. This type of MOSFET can be switched on and off like a conventional MOSFET. When it is switched on (is in its on-state), the gate electrode is biased such that a first conducting channel extends along the gate dielectric in the body region, and the drift control region is biased such that a second conducting channel extends along the drift control region dielectric in the drift region. The drift control structure helps to reduce the on-resistance of the MOSFET at a given doping concentration of the drift region, compared with conventional components which do not include such drift control region.

Ideally, the gate structure and the gate control structure are arranged such that—when the component is in its on-state—the second conducting channel adjoins the first conducting channel. In this case, the on-resistance is further improved.

There is, therefore, a need for producing an electrode structure, in particular a gate electrode structure of a MOSFET aligned with a drift control structure.

SUMMARY

A first embodiment of the invention relates to a method for producing a semiconductor device with an electrode structure. The method includes: providing a semiconductor body with a first surface, and with a first sacrificial layer extending in a vertical direction of the semiconductor body from the first surface; forming a first trench extending from the first surface into the semiconductor body, wherein forming the first trench at least comprises removing the sacrificial layer in a section adjacent to the first surface; and forming a second trench by isotropically etching the semiconductor body in the first trench. The method further includes forming a dielectric layer which covers sidewalls of the second trench; and forming an electrode on the dielectric layer in the second trench. The electrode and the dielectric layer in the second trench form the electrode structure.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1 which includes

FIG. 2 which includes FIGS. 2A and 2B illustrates top views of a semiconductor body in which a longitudinal sacrificial layer is arranged before and after performing the method illustrated in FIGS. 1A to 1F.

FIG. 3 which includes FIGS. 3A and 3B illustrates top views of a semiconductor body in which a ring-shaped sacrificial layer is arranged before and after performing the method illustrated in FIGS. 1A to 1F.

FIG. 4 which includes

FIG. 8 which includes

FIG. 11 which includes FIGS. 11A to 11G illustrates a modification of the method illustrated in FIGS. 7A to 7F.

FIG. 12 which includes

FIG. 13 which includes

FIG. 14 which includes

DETAILED DESCRIPTION

Figure 1A:
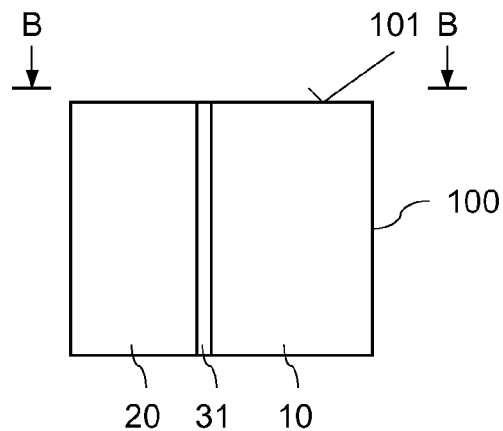
FIGS. 1A to 1F illustrates vertical cross sections through a semiconductor body during method steps of a first method for producing an electrode structure.

Embodiments of the present invention relate to a method for producing an electrode structure, such as a gate electrode structure. Just for illustration purposes, embodiments of this method will be explained in a specific context, namely in the context of producing a gate electrode structure of a transistor device, in particular a MOSFET, which besides a gate electrode structure also includes a drift control structure with a drift control region and a drift control region dielectric. However, the methods illustrated hereinbelow can also be applied to producing electrode structures in other devices, such as capacitors, or to producing gate electrode structures in other types of MOSFET components.

FIGS. 1A to 1F schematically illustrate a first embodiment of a method for producing a semiconductor device with an electrode structure arranged in a semiconductor body 100. The semiconductor body 100 has a first surface 101. FIGS. 1A to 1F show vertical cross sections through the semiconductor body 100 in a vertical section plane, which is a section plane extending perpendicular to the first surface 101. In FIGS. 1A to 1F, as well as in the other figures described hereinbelow, only a section of the semiconductor body 100 is schematically illustrated. In these figures a line designated with reference character 101 represents the first surface of the semiconductor body. However, the other lines do not necessarily represent other surfaces of the semiconductor body. In particular, the lines running perpendicular to the line representing the first surface 101 do not necessarily represent edge surfaces of the semiconductor body 100, and the line opposite to the line representing the first surface 101 does not necessarily represent a second surface opposite to the first surface of 101 the semiconductor body.

Referring to FIG. 1A, the semiconductor body 100 includes a first sacrificial layer which from the first surface 101 extends in a vertical direction of the semiconductor body 100. While the first sacrificial layer 31 in the embodiment illustrated in FIG. 1A extends exactly perpendicular to the first surface 101, in accordance with the present disclosure "a sacrificial layer which extends in a vertical direction of the semiconductor body" also includes those first sacrificial layers 31 which extend in a direction that has an angle other than 90° relative to the first surface 101.

The semiconductor body 100 is, for example, a monocrystalline semiconductor body, so that first and second semiconductor regions 10, 20 adjoining the first sacrificial layer 31 in a lateral direction are monocrystalline semiconductor regions. The semiconductor material of the semiconductor body 100 can be a conventional semiconductor material, like silicon. Generally, any material which can be removed or etched selectively relative to the semiconductor body 100 is suitable for implementing the first sacrificial layer 31. The first sacrificial layer 31 is, for example, an oxide layer, like an SiO$_2$ layer, a nitride layer, like an Si$_3$N$_4$ layer, a carbon (C) layer, or a germanium (Ge) containing layer, like a silicon-germanium layer with a high Ge concentration. Also composite layers with several sub-layers can be used, like a composite layer including an oxide layer and a carbon layer. Between the individual layers of such composite layer thin intermediate layers of a semiconductor material, like silicon can be used, wherein the intermediate layer may include a thickness of only several atoms. According to one embodiment a composite first sacrificial layer has the following sequence of sub-layers: SiO2-(Si)-C-(Si)-C, wherein the Si-layers are optional (and therefore written in parentheses) and may include only several atom layers each.

Various methods are known for producing a sacrificial layer, like sacrificial layer 31 illustrated in FIG. 1A, in a semiconductor body, like the semiconductor body 100 according to FIG. 1A. One of these methods includes: forming a trench in a semiconductor body; producing a sacrificial layer at least on one sidewall of the trench; and filling the trench by epitaxially growing a semiconductor material on the bottom of the trench and/or on those sidewalls of the trench not covered by a sacrificial layer. These methods, however, are known so that no further explanations are required in this regard.

Figure 1B:
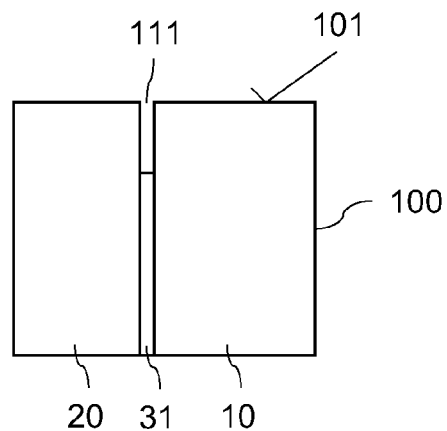

Referring to FIG. 1B, a first trench 111 which extends from the first surface 101 into the semiconductor body 100 is formed. In the embodiment illustrated in FIG. 1B, forming the first trench 111 only includes removing the sacrificial layer 31 in a section adjacent to the first surface 101. Forming the first trench may, however, also include more complex methods, which will be explained herein further below. Removing the first sacrificial layer 31 in the section adjacent to the first surface 101 includes, for example, an etching process which etches the first sacrificial layer 31 selectively against the material of the semiconductor body 100. The depth of the first trench 111 is, for example, defined by the duration of the etching process.

"Etching the first sacrificial layer 31 selectively" relative to the semiconductor body 100 in this context means that the etching medium used for etching the first sacrificial layer 31 etches the material of the first sacrificial layer 31 at an etch rate which is significantly higher (e.g. higher than a factor of 5, preferably higher than a factor of 20) than the etch rate at which the etching medium etches the semiconductor material of the semiconductor body 100. In other words: When the first sacrificial layer 31 is etched, also a part of the semiconductor body 100 can be removed. However, this removed part of the semiconductor body 100 has a significantly smaller volume than the first sacrificial layer 31.

Figure 1C:
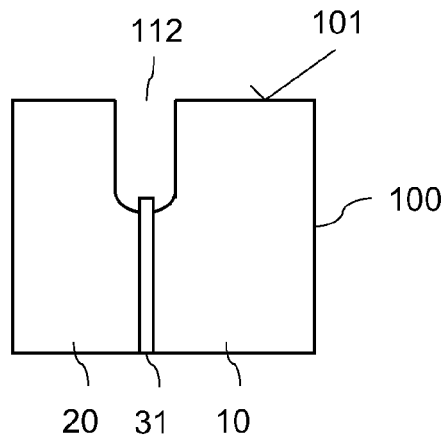

Referring to FIG. 1C a second trench 112 is formed by isotropically etching the semiconductor body 100 in the first trench 111, i.e. by widening the first trench. In this etching process material of the semiconductor body 100 is removed starting from the sidewalls of the first trench 111. In this method also semiconductor material at the first surface 101 can be removed, which is not explicitly illustrated in FIG. 1C. The etching medium used in this process etches the material of the semiconductor body 100 selectively relative to the material of the first sacrificial layer 31. "Etching the material of the semiconductor body 100 selectively" relative to the material of the first sacrificial layer 31 means that the etching medium used for etching the semiconductor body 100 etches the semiconductor body 100 at an etching rate which is significantly higher (e.g. higher than a factor of 5 or even 10) than the etching rate at which the etching medium etches the first sacrificial layer 31. As a result a remainder of the first sacrificial layer 31 extends into the second trench 112 as shown in FIG. 1C.

Figure 1D:
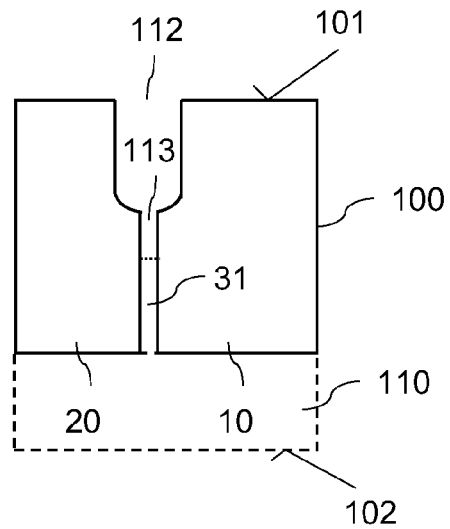

In optional next method steps, the result of which is illustrated in FIG. 1D, a third trench 113 is formed below the second trench 112. This first trench is formed by removing at least a part of the first sacrificial layer 31 below the second trench 112. According to one embodiment the sacrificial layer 31 is completely removed below the second trench 112; this is illustrated in solid lines FIG. 1D. According to a further embodiment that is illustrated in dotted lines in FIG. 1D, the first sacrificial layer 31 is only removed in sections close to a bottom of the second trench 112, so as to form the third trench 113, while the sacrificial layer 31 remains below the bottom of the third trench. According to another embodiment, only those sections of the sacrificial layer 31 are removed that extend into the second trench 112, so that no third trench is formed. According to yet another embodiment, there is no removal of the sacrificial layer 31 after the second trench 112 has been formed. Partly or completely removing the sacrificial layer 31 below the second trench 112 may include an etching process which etches the material of the first sacrificial layer 31 selectively, i.e. much faster, e.g. by a factor of 20 or more, preferably by a factor of 100 or more, than the material of the semiconductor body 100.

The first sacrificial layer 31 is arranged in the semiconductor body 100 such that the semiconductor body 100 is not separated or split into two pieces, even when the sacrificial layer 31 is completely removed when forming the third trench 113. According to one embodiment, which is illustrated in dashed lines in FIG. 1D, the first sacrificial layer 31 in a vertical direction of the semiconductor body 100 does not extend completely through the semiconductor body 100 to a second surface 102 which is opposite to the first surface 101. In this embodiment, even when the first sacrificial layer 31 is completely removed, there is still a continuous material section, e.g. a dielectric and/or semiconductor section and/or a section of the semiconductor body 100, below the third trench 113 which prevents the semiconductor body 100 from being separated into different pieces. This continuous material section is illustrated by the dashed lines in FIG. 1D.

Figure 1E:
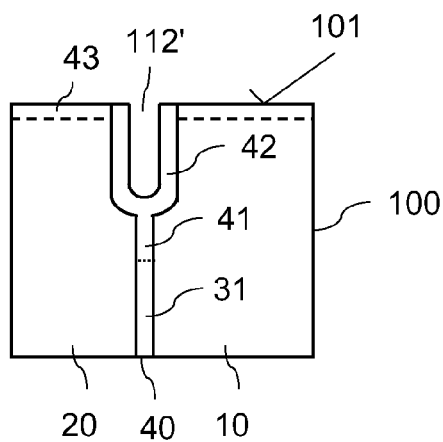

Referring to FIG. 1E, a dielectric layer 40 is then formed along a bottom and the sidewalls of the second trench 112. The dielectric layer 40 only covers the bottom and the sidewalls of the second trench 112, so that a residual trench 112' remains after forming the dielectric layer 40. The dielectric layer 40 is, for example, an oxide layer. This oxide layer can be formed by a thermal oxidation process, by a deposition process, or by a combined process including a thermal oxidation and a deposition process. According to one embodiment, a thin thermal oxide is formed along the sidewalls of the third trench 113. The remaining trench is the filled with an oxide, like $SiO_2$, or a nitride, like $Si_3N_4$, with is conformly deposited in the trench, for example by a CVD (chemical vapor deposition) process. Optionally, a thermal oxidation process follows the deposition process. Alternatively, the remaining trench is filled with a semiconductor material which is then thermally oxidized.

According to a further embodiment (not illustrated) the dielectric layer 40 includes a layer stack with a plurality of at least two different dielectric layers which are formed one above the other on the sidewalls of the second and the third trench 112, 113, wherein this layer stack partially or completely fills the third trench 113.

Figure 1F:
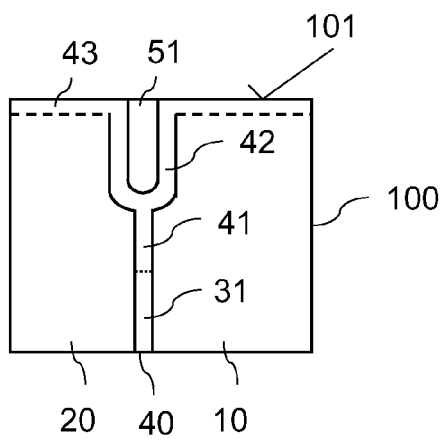

When the third trench 113 is formed below the second trench 112, the dielectric layer 40 is also formed in the third trench and completely fills the third trench. In this case, that is illustrated in solid lines in FIGS. 1E and 1F, the dielectric layer 40 includes two sections: A first section 41 arranged in the third trench 113; and a second section 42 arranged along the bottom and the sidewalls of the second trench 112. The dotted lines illustrated in FIGS. 1E and 1F illustrate an embodiment in which a third trench (113 in FIG. 1D) has been formed and in which a part of the sacrificial layer 31 remained below the third trench 113. In this case, the first section 41 of the dielectric layer 40 adjoins the remaining part of the sacrificial layer. In a further embodiment (not shown) in which the sacrificial layer 31 is not removed below the second trench 112 or is only removed from the bottom of the second trench, there is no first section 41 of the dielectric layer 40, but there is only the second section 42, that covers the sidewalls of the second trench. It should be noted that in each of the embodiments explained below, the first section 41 of the dielectric layer 40 could be replaced partially or completely by the first sacrificial layer 31.

The dielectric layer 40 can also include a third section 43 which is arranged along the first surface 101. This third section 43 is formed, when the first surface 101 during the process of forming the dielectric layer 40 is uncovered. However, it is also possible to cover the first surface 101 during the process of forming the dielectric layer 40 with a protection layer (not illustrated) which prevents the third section 43 of the dielectric layer 40 from being formed.

Referring to FIG. 1F, an electrode layer which forms an electrode 51 is deposited on the dielectric layer 42 in the residual trench 112'. The electrode 51 includes, for example, a polycrystalline semiconductor material, such as n-doped or p-doped polysilicon, or a metal.

In the embodiment illustrated in FIG. 1F, the electrode layer completely fills the residual trench 112'. However, this is only an example. According to a further embodiment (not illustrated) the electrode layer only covers the dielectric layer 42 in the residual trench 112', so that a further residual trench remains. This further residual trench then can be filled with a filling material, like an insulation material or a dielectric material. According to another embodiment, the electrode 51 in the residual trench 112' includes two or more electrode layers which are deposited one above the other and which are comprised of the same electrode material or of different electrode materials. A layer stack with the different electrode layers may completely fill the residual trench 112', or may leave a further residual trench, which is then filled with a filling material, like a dielectric or an insulator.

After the filling process, the residual trench 112' is either completely filled with an electrode and/or a filling material, or there may remain certain gaps or voids buried in the electrode or filling material. Such voids or gaps, however, can be tolerated.

The optional third section 43 of the dielectric layer 40 can be removed before or after forming the electrode 51. During the process steps of filling the residual trench 112' electrode or filling material can be deposited on the third section 43 of the dielectric layer or on the first surface 101 of the semiconductor body. This material can also be removed after forming the electrode 51, wherein this material can be removed together with the optional third section 43 of the dielectric layer. This removal process or these removal processes can, for example, include a polishing method, such as a CMP-method (CMP=chemical-mechanical polishing). Alternatively, the dielectric material and/or the electrode or filling is removed using an isotropic recess etching leaving the electrode 50 material and/or dielectric layer 40 in the trench, e.g. with a small dip below the first surface 101, but completely removing the layer from the first surface 101.

According to a further embodiment, a part of the electrode 50 is removed from the upper part of the residual trench 112', thereby forming a trench above the electrode 50. This trench can now be filled with various other materials. According to one embodiment, a capacitive structure including two electrodes insulated from each other can be formed in this trench.

In the horizontal plane—which is the plane of the first surface 101 or a plane parallel to the first surface—the electrode structure can be produced with different geometries. Referring to FIGS. 2A and 2B which each show a top view on the semiconductor body 100, the electrode structure can be produced with a longitudinal geometry in the horizontal plane. FIG. 2B shows a top view on such electrode structure with a longitudinal geometry. This electrode structure is obtained by applying the method steps illustrated in FIGS. 1A to 1F on a semiconductor body according to FIG. 2A which includes a first sacrificial layer 31 which extends longitudinally in the horizontal plane of the semiconductor body 100.

According to FIG. 3B the electrode structure could also be implemented with a ring-shaped geometry, in particular, the geometry of a rectangular ring. FIG. 3B shows a top view on a semiconductor body 100 with an integrated electrode structure which has the geometry of a rectangular ring in the horizontal plane of the semiconductor body 100. Such electrode structure with a ring-shaped geometry can be obtained by applying the method steps illustrated in FIGS. 1A to 1F on a semiconductor body 100 with a first sacrificial layer 31 that has a ring-shaped geometry in the horizontal plane of the semiconductor body 100. A first sacrificial layer 31 with a ring-shaped geometry is illustrated in FIG. 3A. A first sacrificial layer 31 with a ring-shaped geometry can, for example, be produced by: producing a trench 10 which in the horizontal plane has a rectangular cross section in the semiconductor body 100; forming the first sacrificial layer 31 along the sidewalls of the trench 10; and filling the trench 10 by epitaxially growing a semiconductor material from the bottom of the trench.

Figure 4A:
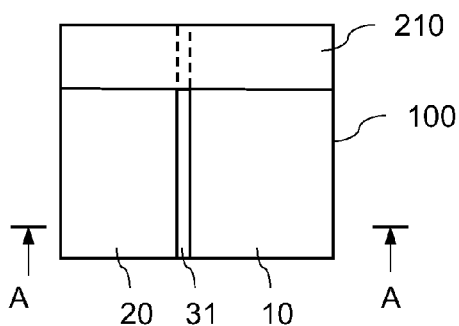
FIGS. 4A and 4B illustrates a modification of the method illustrated in FIGS. 1A to 1F.
Figure 4B:
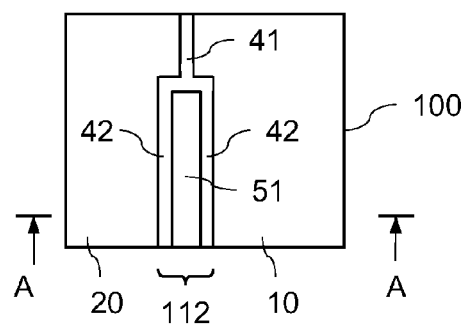

Although FIGS. 2A, 2B and 3A, 3B show that the electrode structure is produced along the complete length of the first sacrificial layer 31, it should be noted that this is only an example. Referring to FIGS. 4A and 4B it is also possible to produce the electrode structure selectively only at selected positions along the first sacrificial layer 31. Referring to FIG. 4A sections where no electrode structures should be produced can be covered with a mask layer 210 on top of the first surface 101 of the semiconductor body 100, while those sections in which an electrode structure is to be produced are uncovered. The mask layer 210 protects the first sacrificial layer 31 during the method step illustrated in FIG. 1B in which the first sacrificial layer 31 is partly removed in order to form the first trench 111. The mask layer 210 can remain on the first surface 111 until the electrode structure is completely produced. However it is also possible to remove the mask layer 210 after forming the first trench 111 in those regions of the sacrificial layer 31 not covered by the mask layer 210. It should be noted that, depending on the used etching process for locally removing the first sacrificial layer 31, the vertical dimension of the resulting trench 112 at the edge of the mask layer 210 can be influenced. In case of an anisotropic etching process for partially removing the sacrificial layer 31, the resulting trench 112 will reach to the edge of the mask layer and will have an essentially homogeneous depth in the vertical direction. In case of an isotropic etching process, for removing the sacrificial layer 31 the resulting trench 112 will reach under the edge of the mask layer 210 and will show a depth that is gradually decreasing from the edge of the mask layer 210 until it reaches the surface of the semiconductor body 100.

The structure with the electrode 51 and the dielectric layer, specifically the second section 42 of the dielectric layer 40 can be used as a gate electrode structure in a MOSFET, with the electrode 51 forming a gate electrode, and the dielectric layer 42 forming a gate dielectric. It should be noted, however, that the electrode structure with the electrode 51 and the dielectric layer 40 is not restricted to be used as a gate electrode structure. The electrode structure could also be part of a capacitor, with the electrode 51 forming a first capacitor electrode, the dielectric layer 40 forming the capacitor dielectric, and the semiconductor material surrounding the dielectric layer 40 forming a second capacitor electrode. The electrode structure could also be part of a wiring arrangement, with the electrode 51 forming a conductor and the dielectric layer insulating the conductor from the semiconductor material.

The use of the electrode structure as a gate electrode structure in a MOSFET will be explained in further detail hereinbelow with reference to FIGS. 5 to 7.

Figure 5:
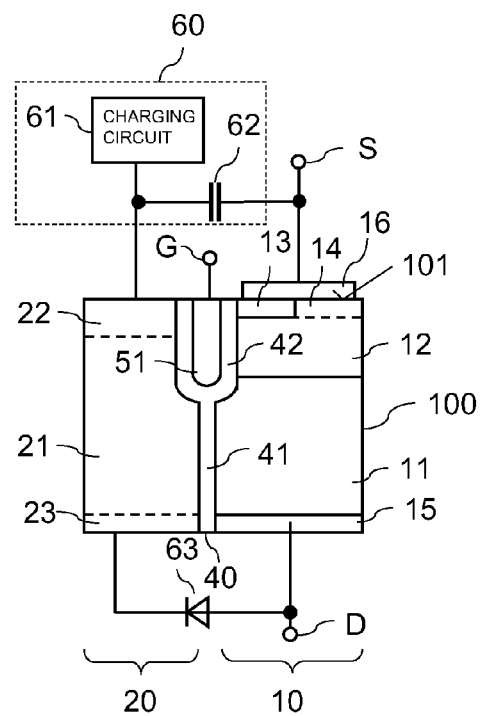
FIG. 5 illustrates a vertical cross section view of a semiconductor device implemented as a transistor device which includes an electrode structure produced in accordance with the method steps illustrated in FIGS. 1A to 1F as a gate electrode structure.

FIG. 5 schematically illustrates a cross section through a transistor according to a first embodiment which includes an electrode structure as a gate electrode structure produced in accordance with the method illustrated in FIGS. 1A to 1F. The transistor is implemented as a MOSFET, but could also be implemented as an IGBT. The MOSFET includes a body region 12 arranged adjacent to the gate dielectric 42 in the first semiconductor region 10, and a source region 13 arranged within the body region 12 and contacted by a source electrode 16. The source electrode 16 also contacts the body region 12, wherein optionally a higher-doped semiconductor region 14 of the same doping type as the body region 12 is arranged between the body region 12 and the source electrode 16. The MOSFET further includes a drift region 11 which in the vertical direction of the semiconductor body 100 adjoins the body region 12 and in a lateral direction of the semiconductor body 100 is arranged adjacent to the first section 41 of the dielectric layer 40. The MOSFET further includes a drain zone 15 which is arranged adjacent to the drift region 11 in the vertical direction of the semiconductor body 100 and which is connected to a drain terminal D (schematically illustrated in FIG. 5). The gate electrode 51 is connected to a gate terminal G.

Besides the gate electrode structure, the MOSFET includes a drift control structure with a drift control region (DCR) 21 and a drift control region dielectric (DCR dielectric) arranged adjacent to the DCR 21 in the lateral direction of the semiconductor body 100. The DCR dielectric 41 is formed by the first section 41 of the dielectric layer 40 and is arranged between the DCR 21 and the drift region 11. The DCR 21 is arranged in the second region 20 of the semiconductor body 100 and, like the drift region 11, includes a monocrystalline semiconductor material. Although in the embodiment illustrated in FIG. 5 (as well as in the embodiments illustrated in FIGS. 6 and 7) the DCR dielectric is formed by the first section of the dielectric layer 40, it should be noted that the DCR dielectric could be partially or completely formed by the first sacrificial layer 31, when in the method steps explained with reference to FIG. 1D the sacrificial layer is not or is only partially removed.

The MOSFET can be implemented as an n-type enhancement MOSFET. In this type of MOSFET the source region 13, the drift region 11 and the drain region 15 are n-doped, while the body region 12 is p-doped. The DCR 21 is either n-doped or p-doped. The MOSFET could also be implemented as a p-type enhancement MOSFET. In this case the doping types of the individual semiconductor regions are complementary to the doping type of the semiconductor regions of an n-type MOSFET.

The operating principle of the MOSFET illustrated in FIG. 5 will now be explained. For explanation purposes it is assumed that the MOSFET is an n-type MOSFET; however, the explanation applies to a p-type MOSFET accordingly. The MOSFET can be switched on and off by applying suitable drive potentials to the gate terminal G connected to the gate electrode 51. When the MOSFET is in its on-state, a first conducting channel extends along the gate dielectric 42 in the body region 12 between the source region 13 and the drift region 11. In an enhancement MOSFET, this first conducting channel in the body region 12 is an inversion channel. Further, there is a second conducting channel in the drift region 11 along the DCR dielectric 41. This second conducting channel is an accumulation channel, when the doping type of the drift region 11 is complementary to the doping type of the body region 12, and is an inversion channel, when the doping type of the drift region 11 corresponds to the doping type of the body region 12. The second conducting channel in the drift region 11 along the DCR dielectric 41 is controlled by the DCR 21. The DCR 21 is connected to a charging arrangement 60 which—in an n-type MOSFET—is configured to keep the electrical potential of the drift control region 21 above the electrical potential of the drift region 11 or even above the electrical potential of the drain region 15, when the component is in its on-state, so that there is the conducting channel in the drift region 11 along the drift control region dielectric 41.

The charging arrangement 60 includes, for example, a charging circuit 61 connected to the drift control region 21, and a charge storage element 62, like a capacitor, connected between the DCR 21 and the source electrode 16 or the source terminal S. The charging circuit 61 provides the electrical charge which is necessary for the DCR 61 to assume an electrical potential which is required for generating the second conducting channel.

When the component is in its off-state, i.e. when an electrical potential is applied to the gate terminal G which interrupts the first conducting channel in the body region 12, and when there is a voltage between the drain and source terminals D, S, a space charge region or depletion region propagates in the drift region 11. The depletion region in the drift region 11, or the electric field associated with the depletion region, causes the drift control region 21 to be also completed of charge carriers. Charge carriers that, in the on-state, are required in the drift control region 21 to control the second conducting channel in the drift region 11 are stored in the charge storage element 42 until the MOSFET is switched on for the next time. Storing the charge carriers in the charge storage element 62 has the advantage that the charging circuit 61 in each switching cycle of the MOSFET has to provide only a part of the charging required in the drift control region 21, namely that part which was subject to losses.

Referring to FIG. 5, the drift control region 21 is optionally coupled to the drain terminal D via an optional connection region 23 and/or a diode 63. The connection region 23 can be of the same doping type as the drift control region 21 but is more highly doped than the drift control region. This diode 63 in an n-type MOSFET is biased such that the electrical potential of the drift control region 21 can rise above the electrical potential of the drain terminal D. The diode 63 helps to prevent the electrical potential of the lower part of the drift control region 21 or connection region 23 from falling below the potential of the drain terminal D in an uncontrolled manner (in an n-type MOSFET). Such an uncontrolled change of the potential in parts of the drift control region 21 or connection region 23 may be caused by an electron accumulation due to thermal charge carrier generation when the MOSFET is blocking.

Charging circuits, like charging circuit 61 of FIG. 5, for charging the drift control region, like drift control region 21, in a MOSFET, are known, so that no further explanations are required in this regard. According to one embodiment, the charging circuit 61 may include a rectifier element, like a diode, connected between a gate terminal G and the drift control region 21.

Optionally in an n-type MOSFET, and when the DCR is n-doped, a p-type semiconductor region 22 is arranged between the charging arrangement 60 and the drift control region 21. In a p-type MOSFET this semiconductor region 22 is n-doped.

Since the gate dielectric 42 and the gate control dielectric 41 are formed by one dielectric layer 40 which extends in the vertical direction of the semiconductor body 100, the first and second conducting channels are formed along the same dielectric layer 40, when the component is in its on-state. Thus, there is no significant gap between these two conducting channels, which helps to reduce the on-resistance of the component.

Figure 6:
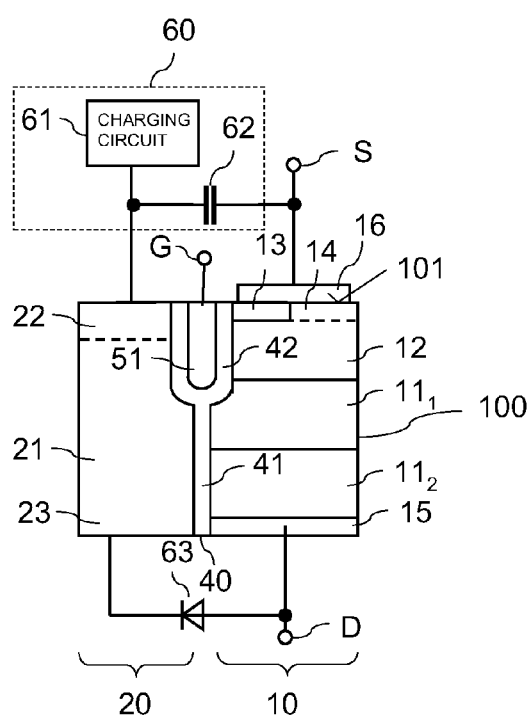
FIG. 6 illustrates a modification of the semiconductor device of FIG. 4.

FIG. 6 illustrates a modification of the MOSFET of FIG. 5. In the MOSFET of FIG. 6, the drift region includes two drift region sections: A first drift region section $11_1$ arranged adjacent to the body region 12 in the vertical direction of the semiconductor body 100, and a second drift region section $11_2$ arranged between the first drift region section $11_1$ and the drain region 15. The first drift region section $11_1$ has the same doping type as the body region 12, and the second drift region section $11_2$ is doped complementarily to the first drift region section $11_1$. The doping concentration of the body region 12 is, for example, in the range of between $10^{16}$ cm$^{-3}$ and $10^{18}$ cm$^{-3}$, the doping concentration of the first drift region section $11_1$ is, for example, in the range of between $10^{13}$ cm$^{-3}$ and $10^{16}$ cm$^{-3}$, and the doping concentration of the second drift region section $11_2$ is, for example, in the range of between $10^{12}$ cm$^{-3}$ and $10^{15}$ cm$^{-3}$ in components having a voltage blocking capability of more than 400V. The second conducting channel built up in the drift region 10 by the potential in the drift control region 20 in this component comprises piecewise both channel types, an inversion channel and an accumulation channel. According to a further embodiment, the drift region 11 completely has the doping type of the body region 12.

Figure 7:
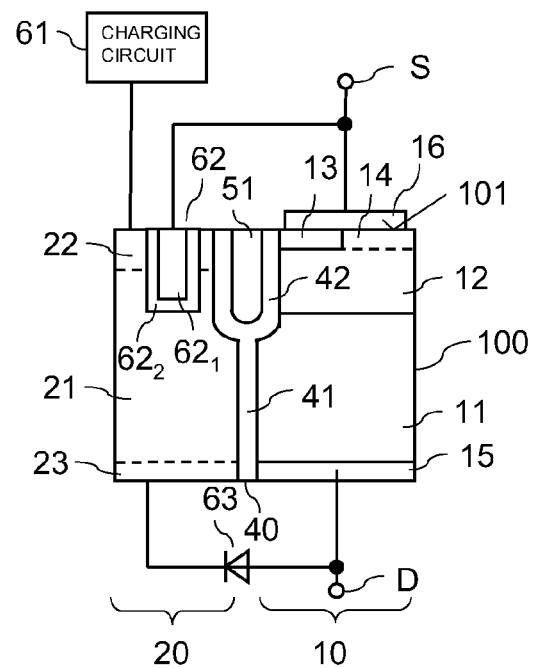
FIG. 7 illustrates a further modification of the semiconductor device of FIG. 4.

FIG. 7 illustrates an embodiment of the MOSFET illustrated in FIG. 5, in which the capacitive charge storage element 62 is integrated in the second semiconductor region 20. The charge storage element 62 includes a first electrode $62_1$ which is arranged in a trench extending into the second semiconductor region 20 from the first surface 101. Within the semiconductor body 100 the first electrode $62_1$ is surrounded by a capacitor dielectric $62_2$. The first electrode $62_1$ forms a first capacitor electrode. A second capacitor electrode is formed by the DCR 21 and the optional semiconductor region 22.

It should be mentioned that a plurality of first electrodes $62_1$ and capacitor dielectrics $62_2$ can be formed in the second semiconductor region 20 in order to increase the capacitance of the charge storage element 62.

It should be mentioned that the optional semiconductor region 22 may be arranged only in a part of the semiconductor region 20, e.g. only in a region forming a contact to an electrode connected to the charging circuit 61. Further, the optional semiconductor region 22 may reach deeper into the semiconductor body 100 in a vertical direction than the storage elements 62.

FIGS. 5 to 7 illustrate only one transistor cell of a MOSFET. It should be mentioned that the MOSFET may include a plurality of the transistor cells illustrated in FIGS. 5 to 7, wherein each cell includes a source, body, drift and drain region, as well as a gate electrode structure and a drift control structure. The source regions 13 of the individual transistor cells are connected together, the drain regions 15 of the individual transistor cells are connected together, and the gate electrodes 51 of the individual transistor cells are connected together. The charging circuit 61 can be common to the drift control regions 21 of the individual transistor cells. The type of transistor cells illustrated in FIGS. 5 to 7 can be referred to as "Y-cells" because of the specific geometry of the dielectric layer 40 which looks similar to the capital letter Y.

In the Y-cell the gate electrode structure and the dielectric layer 41 below the gate electrode structure have been produced in a self-aligned manner.

Figures 8A, 8B:
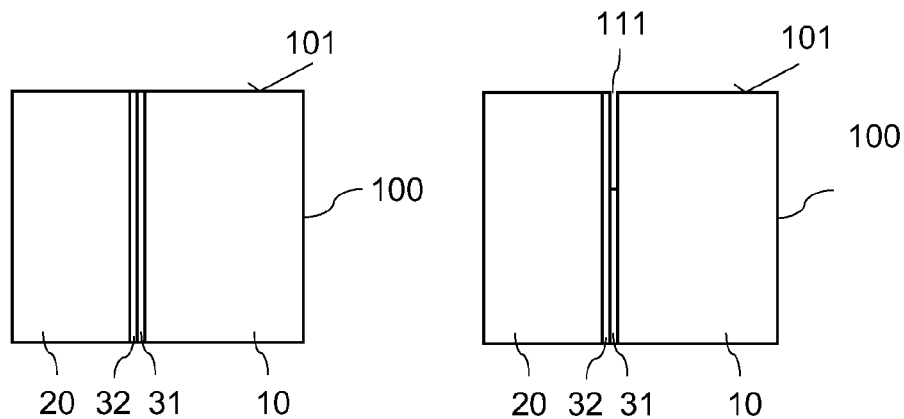
FIGS. 8A to 8F illustrates a second embodiment of a method for producing an electrode structure.

FIGS. 8A to 8F which show vertical cross sections of a semiconductor body 100, illustrate a modification of the method for producing an electrode structure illustrated in FIGS. 1A to 1F. Referring to FIG. 8A, in this method a semiconductor body 100 includes the first sacrificial layer 31 and further includes a second sacrificial layer 32 which adjoins the first sacrificial layer 31 and which also extends in the vertical direction of the semiconductor body 100. Everything which has been discussed concerning the geometry of the first sacrificial layer 31 hereinbefore applies to the layer stack with the first and the second sacrificial layer 31, 32 accordingly.

Referring to FIG. 8B, the first trench 111 is formed by removing a part of the first sacrificial layer 31. Forming the first trench 111 includes, for example, an etching process which etches the first sacrificial layer 31 selectively against the semiconductor body 100 and selectively against the second sacrificial layer 32. Sidewalls of the first trench 111 are formed by the semiconductor body 100 and the second sacrificial layer 32.

Figures 8C, 8D:
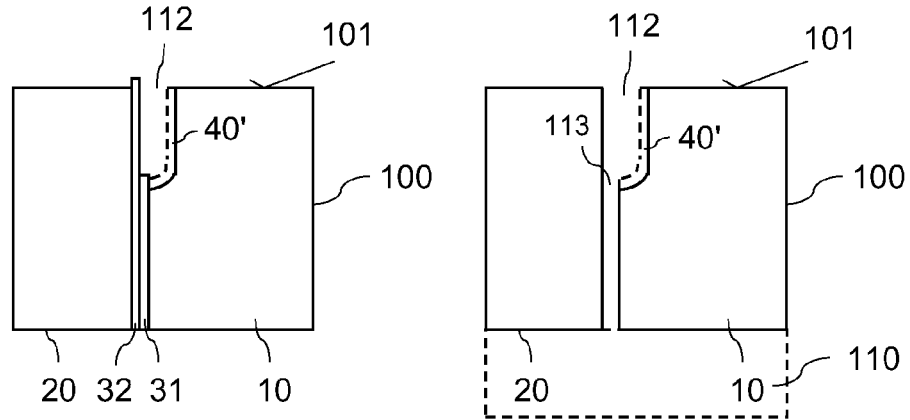
Figure 8E:
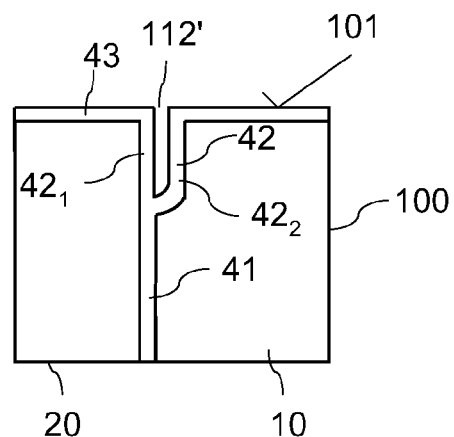

Referring to FIG. 8C, the second trench 112 is formed by isotropically etching the semiconductor body 100 in the first trench 111. In this etching process the second sacrificial layer 32 acts as a protection layer of the semiconductor body 100, so that the semiconductor body 100 is only etched at the sidewall of the first trench 111 which is opposite to the second sacrificial layer 32. Unlike the second trench 112 illustrated in FIG. 1C, the second trench 112 according to FIG. 8C is not symmetrical relative to a vertical plane defined by the first sacrificial layer 31.

Referring to FIG. 8D a third trench 113 is formed below the second trench 112 by partly or completely removing the first sacrificial layer 31 below the second trench 112. Before removing the first sacrificial layer 31 below the second trench 112 or after removing the first sacrificial layer 31 below the second trench 112 the second sacrificial layer 32 is removed in the second and third trench 112, 113. Removing the second sacrificial layer 32 includes, for example, an etching process which etches the second sacrificial layer 32 selectively against the semiconductor body 100. The second sacrificial layer 32 includes, for example, carbon or silicon-germanium (SiGe) with a high Ge concentration.

Like in the method explained with reference to FIGS. 1A to 1F, forming the third trench 113 by removing the first sacrificial layer 31 and the second sacrificial layer 31 is optional in the method according to FIGS. 8A to 8F. According to one embodiment, the second sacrificial layer 32 is removed from the sidewall of the second trench 112 but the first sacrificial layer 31 and the second sacrificial layer 32 remain in place below the second trench 112.

The remaining method steps correspond to the method steps that have been explained in detail with reference to FIGS. 1E and 1F. These method steps include forming the dielectric layer 40 along the sidewalls of the second trench 112, and include forming the dielectric layer 40 in the third trench 113, if there is a third trench 113. The dielectric layer 40 may completely fill the third trench 113 and may only cover the sidewalls of the second trench 112, so that a residual trench 112' remains (see FIG. 8E). The remaining method steps further include forming the electrode 51 in the residual trench 112'. Everything which has been discussed in connection with FIGS. 1E and 1F concerning forming the dielectric layer 40 in the second trench and the optional third trench and concerning the electrode 51 applies to the method according to FIGS. 8E and 8F accordingly.

The dielectric layer 42 along the sidewalls of the second trench 112 includes two layer section: a first layer section $42_1$ adjacent to the second semiconductor region 20, and a second layer section $42_2$ adjacent to the first semiconductor region 10. The first section $42_1$ and the dielectric layer 41 form a longitudinal dielectric layer adjacent to the second semiconductor region. According to one embodiment, an interface between this longitudinal dielectric layer and the second semiconductor region 20 is plane, i.e. does not have a step in a horizontal direction. Such a dielectric layer with a plane surface can be formed by a thermal oxidation process which is stopped as soon as the third trench 113 is completely filled. In this case, a thickness of the first section $42_1$ (and the second section $42_2$) is about half the thickness of the dielectric layer 41 in the third trench. If the oxidation process is not stopped when the third trench 113 is completely filled, layer thicknesses of more than half the layer thickness of layer 41 can be obtained. However, this causes the first section $42_1$ to extend deeper into the second semiconductor region 20 in a horizontal direction of the semiconductor body 100, so that a step at the position where the layer 41 and section $42_1$ adjoin each other is produced.

Alternatively, a thermal oxidation process is stopped before the third trench 113 is completely filled and a residual trench is filled by depositing a dielectric material. Through this, also a dielectric layer with a planar interface is produced.

Referring to FIG. 8C, an optional dielectric layer 40' is formed on those sections of the second trench 112 not covered by the second sacrificial layer 32. This optional dielectric layer 40' is, for example, an oxide layer that can be formed using a thermal oxidation process and/or a deposition process. In the method step illustrated in FIG. 8E, the optional dielectric layer 40' becomes a part of the dielectric layer $42_1$ adjoining the first semiconductor region 10. A process in which the optional dielectric layer 40' is formed results an electrode structure in which the dielectric layer $42_1$ adjoining the first semiconductor region 10 is thicker than the dielectric layer $42_1$ adjoining the second semiconductor region 20. However, this is not illustrated in FIG. 8E.

Figure 8F:
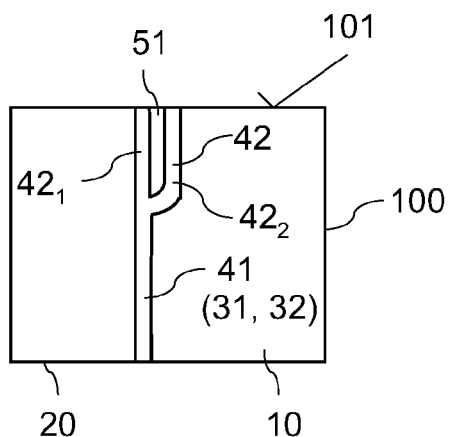

A process in which the method steps of forming the third trench 113 are omitted, results in a structure as illustrated in FIG. 8F with the difference that the structure would include the first and second sacrificial layers 31, 32 instead of the first section 41 of the dielectric layer. This is indicated by the reference characters in parentheses in FIG. 8F.

Figure 10:
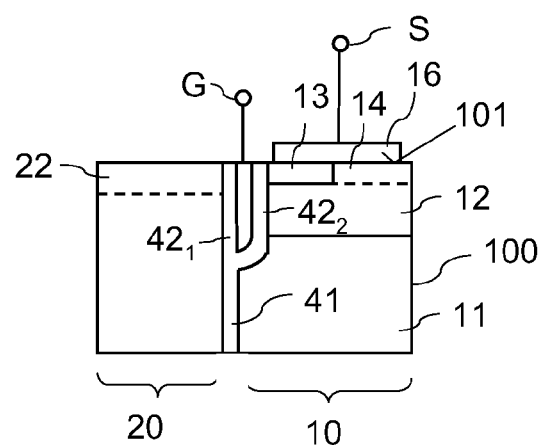
FIG. 10 illustrates a vertical cross sectional view of a further transistor device implemented with an electrode structure produced in accordance with the method of FIGS. 8A to 8F as a gate electrode structure.
Figure 9:
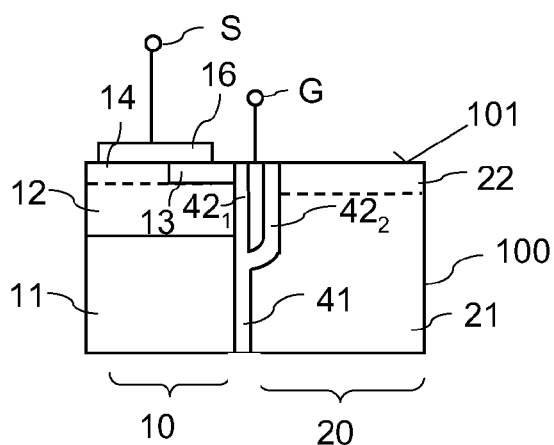
FIG. 9 illustrates a vertical cross sectional view of a transistor device implemented with an electrode structure produced in accordance with the method of FIGS. 8A to 8F as a gate electrode structure.

FIGS. 9 and 10 illustrate embodiments of transistor cells implemented with an electrode structure produced in accordance with the method of FIGS. 8A to 8F as a gate electrode structure. In FIGS. 9 and 10 only upper sections of the transistor cells are shown, i.e. those sections of the transistor cell which include the gate electrode structure. In the electrode structure illustrated in FIG. 8F the dielectric layer 42 has two sections: A first section $42_1$ which is aligned with the section 41 of the dielectric layer 40 in the third trench; and a second section $42_2$ which in the lateral direction is off that too the section 41 of the dielectric layer 40 in the third trench. The difference between the transistor cells illustrated in FIGS. 9 and 10 is that in FIG. 9 the body region 12 is adjacent to the first section $42_1$ of the gate dielectric, while in the embodiment according to FIG. 10 the body region 12 is adjacent to the second section $42_2$ of the gate dielectric. In the embodiment of FIG. 9, when the component is in its on-state, the second conducting channel is aligned with the first conducting channel.

In particular when the electrode structure explained with reference to FIGS. 8A to 8F is implemented as a gate electrode structure in a semiconductor device as illustrated in FIG. 10 in which the second section $42_2$ adjoins the drift control region 21, the second section $42_2$ can be produced to be thicker than the first section $42_1$ in order to reduce the gate-drain-capacitance of the transistor device.

Figure 11A:
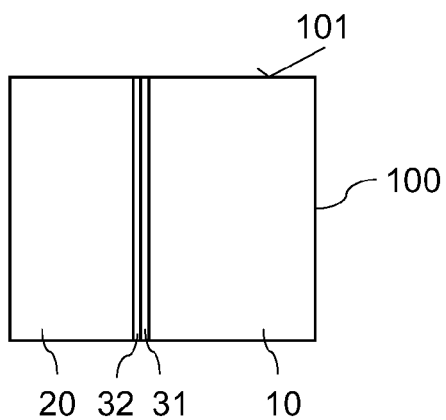
Figure 11B:
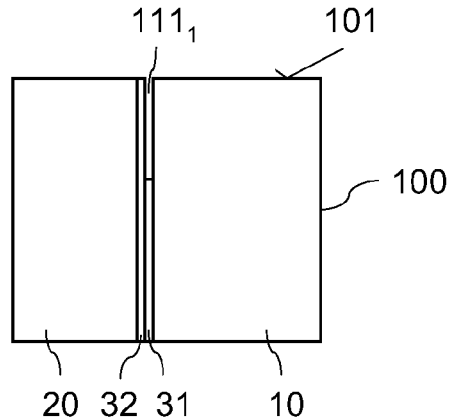
Figure 11C:
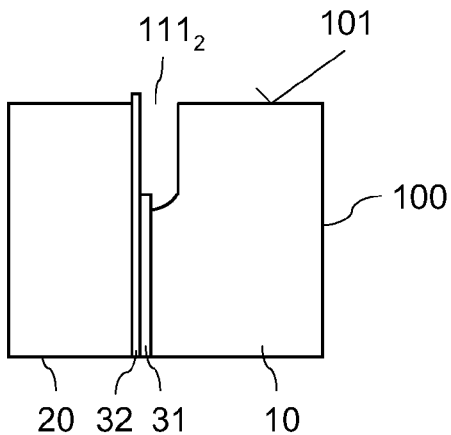
Figure 11D:
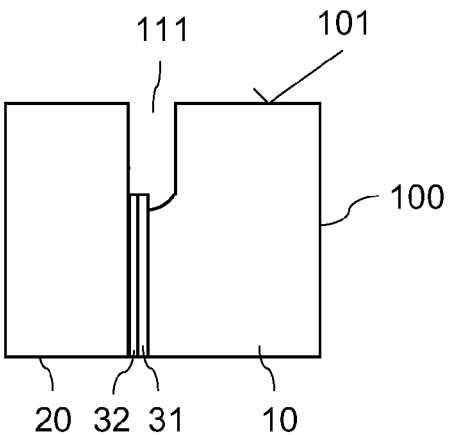

FIGS. 11A to 11G illustrate a modification of the method illustrated in FIGS. 8A to 8F. In this method, forming the first trench 111 does not only include removing a part of the first sacrificial layer 31, but also includes at least one isotropically etching process. In this method, after providing the semiconductor body 100 with first and second sacrificial layers 31, 32 (see FIG. 11A), a first section $111_1$ of the first trench 111 is formed by removing a part of the first sacrificial layer 31. Referring to FIG. 11C, the semiconductor body 100 is then isotropically etched in the first section $111_1$ of the first trench, wherein the second sacrificial layer 32 protects the semiconductor body 100 from being etched. This forms a second section $111_2$ of the first trench. Then, referring to FIG. 11D, the second sacrificial layer 32 is removed in the second section 111$_2$ which results in the first trench 111.

Figure 11E:
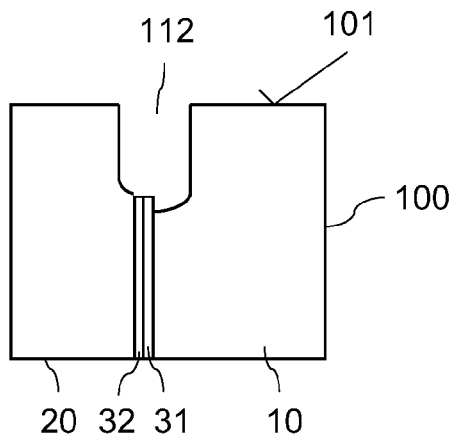

Referring to FIG. 11E, the semiconductor body 100 is isotropically etched in the first trench 111 in order to form the second trench 112. The remaining method steps correspond to the method steps illustrated in FIGS. 1E and 1F or FIGS. 8E and 8F. These method steps include: optionally removing the first and the second sacrificial layers 31, 32 below the second trench 112 in order to form the third trench 113; forming the dielectric layer 40 in the third trench 113 and along the sidewalls of the second trench 112, as well as optionally below the first surface 101 (see FIG. 11E); and forming the electrode 51 (see FIG. 11G). Like in the method explained with reference to FIGS. 1A to 1G forming the third 113 trench below the second trench 112 is optional. Instead of forming the third trench and filling the third trench with the dielectric layer 40 so as to form the first section 41 of the dielectric layer 40, the first and second sacrificial layers 31, 32 could remain below the bottom of the second trench 112.

Figure 12A:
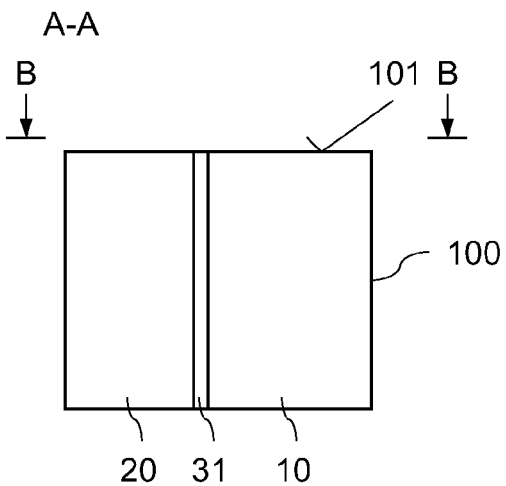
FIGS. 12A to 12H illustrates a modification of the method illustrated in FIGS. 1A to 1F.
Figure 12B:
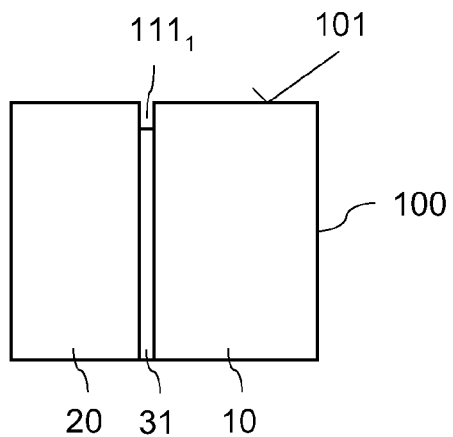
Figure 12C:
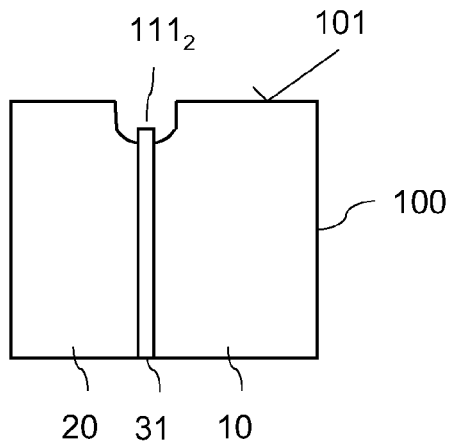

Another modification of the method illustrated in FIGS. 1A to 1F will be explained with reference to FIGS. 12A to 12H. In the method according to FIGS. 12A to 12H forming the first trench 111 does not only include removing a part of the first sacrificial layer 31, but also includes at least one isotropical etching process. After providing the semiconductor body with the first sacrificial layer 31 (see FIG. 12A) a first section of the first trench 111$_1$ is formed by removing a part of the first sacrificial layer 31 in the region of the first surface 101 (see FIG. 12B). Referring to FIG. 12C, a second section 111$_2$ of the first trench 111 is formed by isotropically etching the semiconductor body 100 in the first section 111$_1$. Then, referring to FIG. 12D, a further part of the sacrificial layer 31 is removed below the second section 111$_2$, so that the first trench 111 is formed. This first trench 111 includes the second section 111$_2$ and a third section 111$_3$ obtained by removing the further part of the first sacrificial layer 31. The first trench 111 according to FIG. 12D is symmetrical relative to a vertical plane defined by the first sacrificial layer 31.

Figure 12D:
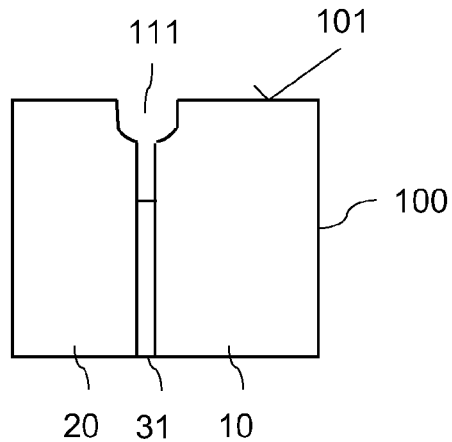
Figure 12E:
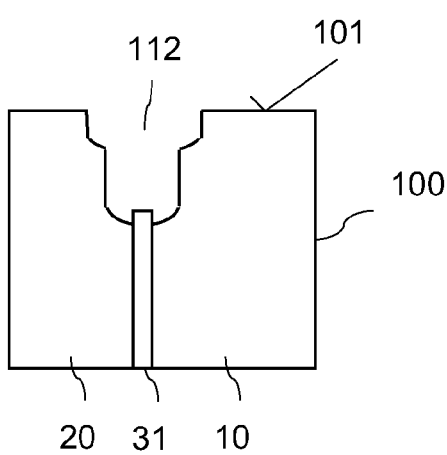
Figure 12F:
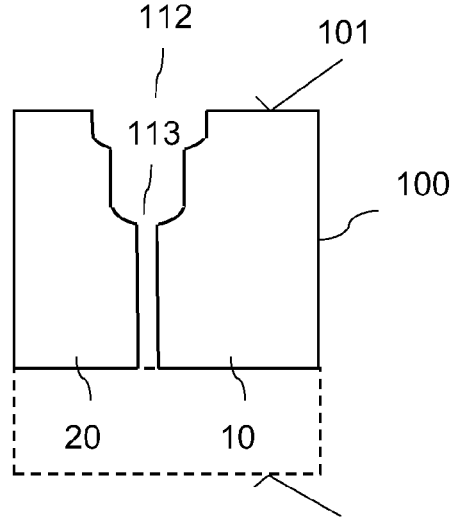
Figure 12G:
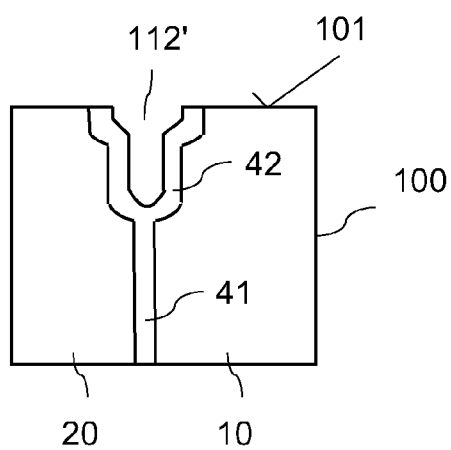
Figure 12H:
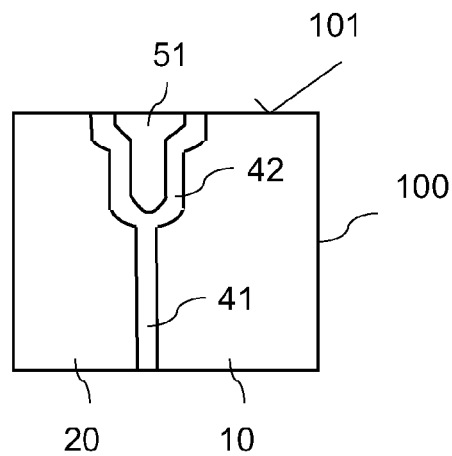

The first trench 111 of FIG. 12D-*unlike* the first trenches in the embodiments explained hereinbefore with reference to FIGS. 1A to 1F or 8A to 8F, is not only defined by a removed section of the first sacrificial layer 31 but is also defined by a first isotropical etching process. Consequently, the first trench 111 has a wider section in the region close to the first surface 111, and has a narrower section in a region more distant to the first surface 111. In the method according to FIGS. 12B to 12D the methods steps of removing a section of the first sacrificial layer 31, isotropically etching the semiconductor body 100, and removing a further section of the semiconductor 100 are performed once. However, these method steps could also be performed several times for generating first trench with several sections having different widths.

The method steps after forming the first trench 111 correspond to the method steps explained with reference to FIGS. 1C to 1F. These method steps include forming the section trench 112 by isotropically etching the semiconductor body 100 in the first trench 111 (see FIG. 12E). Partly or completely removing the first sacrificial layer 31 below the second trench 112 in order to form the third trench 113 (see FIG. 12F); forming the dielectric layer 40 in the third trench 113 and along the sidewalls of the second trench 112 (see FIG. 12G); and forming the electrode 51 (see FIG. 12H). Like in the method explained with reference to FIGS. 1A to 1G forming the third 113 trench below the second trench 112 is optional. Instead of forming the third trench and filling the third trench with the dielectric layer 40 so as to form the first section 41 of the dielectric layer 40, the first sacrificial layers 31 could remain below the bottom of the second trench 112.

Referring to FIGS. 5 to 7 the gate electrode 51 of the MOSFET is connected to a gate terminal for applying a gate drive potential. For connecting the gate electrode 51 a contact pad or landing pad is required on the gate electrode 51 in the region of the first surface 111. This contact pad or landing pad can require a certain area larger than the area available on the gate electrode 51. However, it is not desirable to completely implement the gate electrode 51 with a large area sufficient for a contact or a landing pad. FIGS. 13A to 13D illustrate a method for producing a gate electrode which includes a contact or landing pad. FIGS. 13A to 13G show top views on the first surface of the semiconductor body 100. This method will be explained based on the method according to FIGS. 1A to 1F. However, each of the other methods illustrated hereinbefore can be modified accordingly.

Figure 13A:
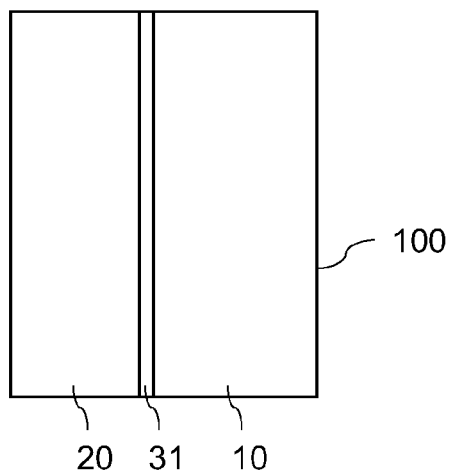
FIGS. 13A to 13G illustrates a further modification of the method illustrated in FIGS. 1A to 1F.
Figure 13B:
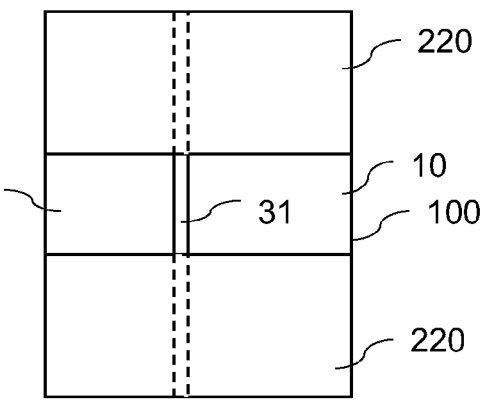
Figure 13C:
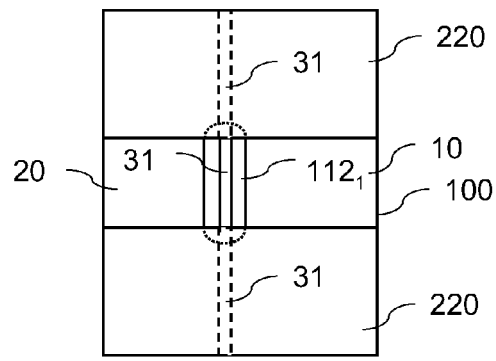

In this method, after providing the semiconductor body 100 with the first sacrificial layer 31 (see FIG. 13A), sections of the first surface 101 are covered by a mask layer 220. Referring to FIG. 13C a first section 112$_1$ of the second trench is formed in those regions of the semiconductor body 100 not covered by the mask layer 220. Forming the first section 112$_1$ of the second trench includes forming a first section of a first trench by partly removing the first sacrificial layer 31, and includes isotropically etching the semiconductor body 100 in the first section of the first trench. In FIG. 13C, reference number 31 denotes the sacrificial layer 31 which remains at or below the bottom of the first section 112$_1$ of the second trench.

During the isotropical etching process, the semiconductor body is also etched below the edges of the mask 220, so that the first section 112$_1$ of the second trench in its longitudinal direction slightly extends below the mask layer 220. This is illustrated in dotted lines in FIG. 13C.

Figure 13D:
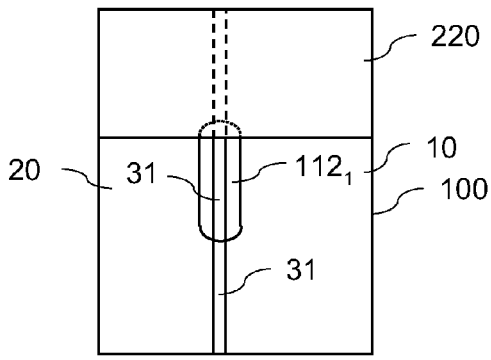
Figure 13E:
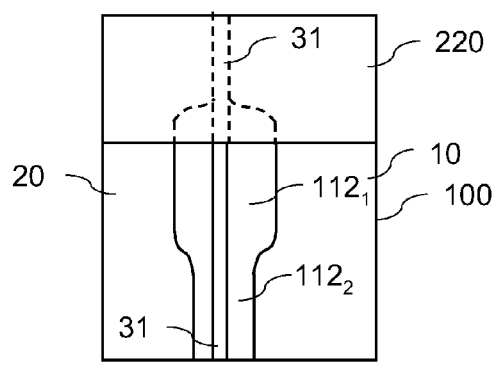

Referring to FIG. 13D the mask layer 220 or at least a part of the mask layer 220, is removed, so that a section of the first sacrificial layer 31 adjoining the first section 112$_1$ of the second trench in a lateral direction is uncovered. Referring to FIG. 13E, the first sacrificial layer 31 is partly removed in this section to form a second section of a first trench, and the semiconductor body is isotropically etched in the first section 112$_1$ of the second trench and in the second section of the first trench, so as to form a second trench 112 which in the lateral direction has a varying width. When the sacrificial layer 31 is removed to form the second section of the first trench, also a part of the sacrificial layer at the bottom or below the bottom of the first section 112$_1$ of the second trench is removed. During the etching process which follows the process of forming the second section of the first trench, the second section 112$_2$ of the second trench is formed and the first section 112$_1$ of the second trench becomes wider and deeper.

The second trench 112 illustrated in FIG. 13E has two trench sections with different trench widths: the wider and deeper first section 112$_1$; and the narrower and shallower second section 112$_2$.

Figure 13F:
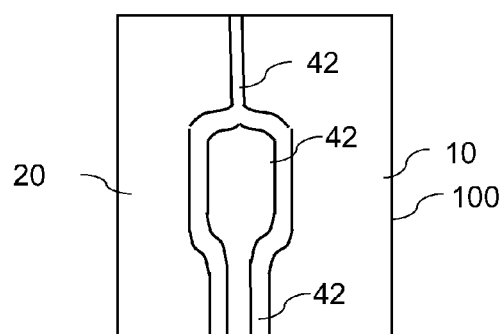
Figure 13G:
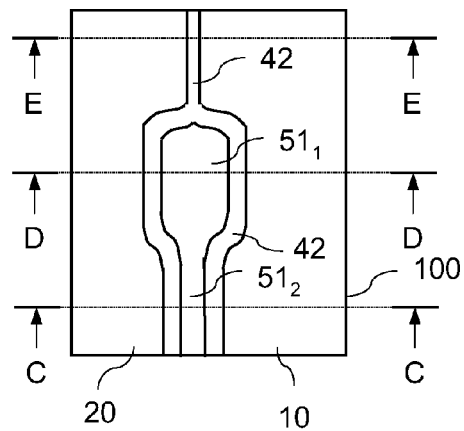

The remaining method steps, which are illustrated in FIGS. 13F and 13G, correspond to the method steps illustrated in FIGS. 1D to 1F. These method steps include removing the first sacrificial layer 31 below the second trench 112 and, forming the dielectric layer 42 (see FIG. 13F) and forming the gate electrode (see FIG. 13G). The electrode 51 has two electrode sections: A wider section 51$_1$ which is formed in first section 112$_1$ of the second trench, i.e. in that region of the semiconductor body which from the beginning was not covered by the mask layer 220; and a second section 51$_2$, which is formed in the second section $112_2$ of the second trench, i.e. in a region which was at the beginning covered by the mask layer 220.

In the embodiment illustrated in FIGS. 13A to 13G sections of the semiconductor body and the first sacrificial layer 31 stay covered by the mask layer 220 during the method steps of forming the second trench 112, so that in those regions no trench is formed. This mask layer is removed before the method step of removing the sacrificial layer 31 below the second trench 112, so that the sacrificial layer 31 is also removed from this section to form a third section of the first trench. The dielectric layer 42 is also formed in this third section of the first trench, but no electrode is formed in this section.

Figure 14A:
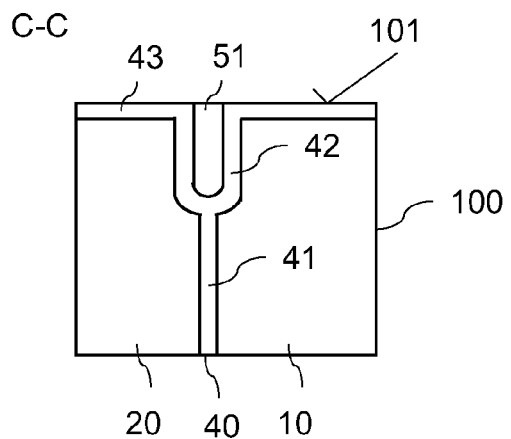
FIGS. 14A to 14C illustrates vertical cross sectional views of the structure illustrated in FIG. 13G.
Figure 14B:
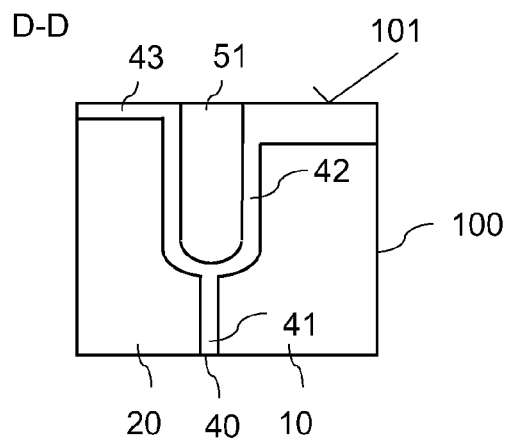
Figure 14C:
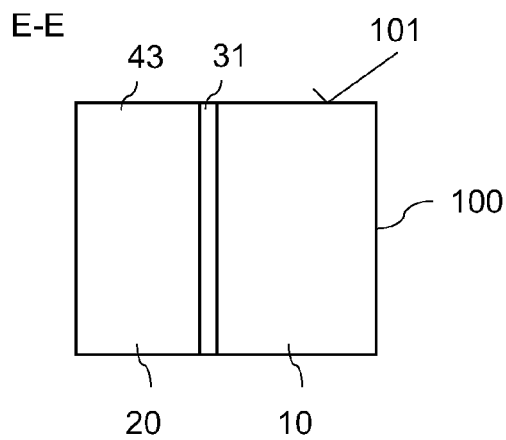

Vertical cross sections through the arrangement illustrated in FIG. 13G in section planes C-C, D-D and E-E are illustrated in FIGS. 14A to 14C. Vertical section plane C-C cuts through the narrower second section $51_2$ of the electrode, section plane D-D cuts through the wider first section $51_1$ of the electrode 51, and section plane E-E cuts through an area in which no gate electrode has been formed.

Finally it should be mentioned that features which have been explained in connection with one embodiment can also be combined with features of other embodiments even when this has not explicitly been mentioned herein before.

What is claimed is:

1. A method for producing a semiconductor device with an electrode structure, the method comprising:
   providing a semiconductor body with a first surface, and with a first sacrificial layer extending in a vertical direction of the semiconductor body from the first surface, the first sacrificial layer including a material different than the semiconductor body that can be removed or etched selectively relative to the semiconductor body;
   forming a first trench extending from the first surface into the semiconductor body, wherein forming the first trench at least comprises removing the sacrificial layer in a section adjacent to the first surface;
   forming a second trench by isotropically etching the semiconductor body in the first trench;
   forming a dielectric layer which covers sidewalls of the second trench; and
   forming an electrode on the dielectric layer in the second trench, the electrode and the dielectric layer in the second trench forming the electrode structure.

2. The method of claim 1, further comprising:
   forming a third trench below the second trench by removing at least a part of the first sacrificial layer below the second trench; and
   wherein the dielectric layer covering the sidewalls of the second trench also covers sidewalls of the third trench.

3. The method of claim 2, wherein the dielectric layer completely fills the third trench.

4. The method of claim 1, wherein forming the dielectric layer comprises one of depositing a dielectric layer and thermally growing a dielectric layer.

5. The method of claim 2, wherein forming the dielectric layer in the third trench comprises:
   forming a dielectric layer along the sidewalls of the third trench, leaving a residual trench; and
   filling the residual trench with a filling material.

6. The method of claim 5, wherein the filling material is a dielectric material.

7. The method of claim 1, wherein the first sacrificial layer includes an oxide layer, a nitride layer, a carbon layer or a germanium containing layer.

8. The method of claim 7, wherein the first sacrificial layer is a composite layer which includes at least two sublayers.

9. The method of claim 8, wherein a thin semiconductor layer several atoms thick is formed between two of the at least two sublayers.

10. The method of claim 2, wherein forming the third trench comprises completely removing the first sacrificial layer.

11. The method of claim 2, wherein forming the third trench comprises only partly removing the first sacrificial layer below a bottom of the second trench.

12. The method of claim 1, wherein the semiconductor body further includes a second sacrificial layer adjacent to the first sacrificial layer.

13. The method of claim 12, wherein the second sacrificial layer includes at least one of a carbon layer, germanium containing layer, an oxide layer, or a nitride layer.

14. The method of claim 13, wherein the first sacrificial layer is a composite layer which includes at least two sublayers.

15. The method of claim 14, wherein a thin semiconductor layer several atoms thick is formed between two of the at least two sublayers.

16. The method of claim 12, further comprising removing the second sacrificial layer after forming the second trench and before forming the dielectric layer, wherein the second sacrificial layer is removed at least from the second trench.

17. The method of claim 16, further comprising forming a further dielectric in the second trench before removing the second sacrificial layer at least from the second trench.

18. The method of claim 2, wherein the semiconductor body further includes a second sacrificial layer adjacent to the first sacrificial layer, the method further comprising:
   removing the second sacrificial layer after forming the second trench and before forming the dielectric layer, wherein the second sacrificial layer is removed at least from the second trench.

19. The method of claim 12, wherein forming the first trench comprises:
   forming a first trench section by removing a part of the first sacrificial layer in a section adjacent to the first surface;
   isotropically etching the semiconductor body in the first trench section to form a second section of the first trench; and
   removing the second sacrificial layer from the second trench section.

20. The method of claim 1, wherein forming the first trench comprises:
   removing a first section of the first sacrificial layer in a region below the first surface to form a first section of the first trench;
   isotropically etching the semiconductor body in the first section of the first trench;
   removing a second section of the first sacrificial layer in a region below the first section of the first trench to form a second section of the first trench; and
   isotropically etching the semiconductor body in the first and second sections of the first trench.

21. The method of claim 1, wherein forming the first trench only comprises removing the sacrificial layer in a section adjacent to the first surface.

22. The method of claim 1, wherein the semiconductor device is a transistor and wherein the electrode structure is a gate electrode structure.

23. The method of claim 22, wherein the first sacrificial layer is arranged between a first and a second semiconductor region, the method further comprising:

forming a body region of a first doping type in the first semiconductor region adjacent to the gate electrode structure;

forming a source region of a second doping type, which is complementarily to the first doping type, in the body region;

forming a drift region in the first semiconductor region, the drift region adjoining the body region and adjoining the dielectric layer in a region below the electrode structure; and forming a source electrode connecting the body region and the source region.

24. The method of claim 23, wherein the drift region is of the second doping type.

25. The method of claim 23, wherein the drift region is of the first doping type.

26. The method of claim 23, wherein the drift region comprises:
- a first section of the first doping type adjacent to the body region; and
- a second section of the second doping type, the second section adjoining the first section at a side opposite to the body region.

* * * * *